United States Patent [19]

Amendola et al.

[11] Patent Number: 4,546,065

[45] Date of Patent: Oct. 8, 1985

[54] PROCESS FOR FORMING A PATTERN OF METALLURGY ON THE TOP OF A CERAMIC SUBSTRATE

[75] Inventors: Albert Amendola, Hopewell Jct.; Arnold F. Schmeckenbecher, Poughkeepsie; Joseph T. Sobon, New Paltz, all of N.Y.

[73] Assignee: International Business Machines Corporation, Armonk, N.Y.

[21] Appl. No.: 521,464

[22] Filed: Aug. 8, 1983

[51] Int. Cl.[4] .......................... G03F 1/00; G03F 7/00; B23P 19/00
[52] U.S. Cl. ........................................ 430/313; 430/5; 430/311; 430/318; 29/847; 29/848; 29/851
[58] Field of Search .................. 430/313, 318, 311, 5; 427/96, 123, 126.2, 227; 29/847, 848, 851

[56] References Cited

U.S. PATENT DOCUMENTS

| | | | |
|---|---|---|---|
| 3,770,529 | 11/1973 | Anderson | 29/851 |
| 4,109,377 | 8/1978 | Blazick et al. | 427/126.2 |
| 4,374,457 | 2/1983 | Wiech | 29/848 |
| 4,435,498 | 3/1984 | Baillie | 430/318 |

*Primary Examiner*—Richard L. Schilling
*Attorney, Agent, or Firm*—Sughrue, Mion, Zinn, Macpeak, and Seas

[57] ABSTRACT

A process for forming a pattern of conductive lines on the top of a multi-layer ceramic substrate comprising:
providing a green ceramic substrate, embossing a pattern of grooves in the top surface of the green ceramic substrate,
sintering the green ceramic substrate to thereby form a multi-layer ceramic substrate and
depositing a conductive material in at least a portion of said embossed pattern of grooves.

11 Claims, 6 Drawing Figures

PROCESS FOR FORMING A PATTERN OF METALLURGY ON THE TOP OF A CERAMIC SUBSTRATE

BACKGROUND OF THE INVENTION

1. Field of the Invention:

The present invention relates to a process for forming a pattern of metallurgy on the top of a ceramic substrate.

2. Description of the Prior Art:

A relatively recent innovation in electronic packaging has been the development of the multilayer ceramic (hereafter MLC) module. In this technology "green" sheets of ceramic powder held together by a temporary organic binder are metallized with a noble or refractory metal, usually, but not mandatorily, by screen printing. The metallized sheets are stacked, laminated and fired to form a monolithic ceramic-metal package. Details on MLC technology are given in SOLID STATE TECHNOLOGY, May 1972, Vol. 15, No. 5, pages 35–40, Kaiser et al, hereby incorporated by reference.

It is known that "green" sheets as described shrink non-uniformly during sintering, and that this non-uniform shrinkage can cause filled via holes within the ceramic substrate to be out of alignment with a top layer of metallurgy which is deposited after sintering.

IBM Technical Disclosure Bulletin, Vol. 22, No. 12, May, 1980, pages 5328 and 5329 discloses that the via holes (hereafter often merely vias) in MLC structures are often misregistered after sintering due to non-uniform shrinkage of the ceramic. This Technical Disclosure Bulletin suggests using E-beam scans to record the location of vias on the top of the MLC, metallizing, applying a photoresist, E-beam exposing so that a 0.001 clearance is generated and then etching, leaving a rectangular pad with a clearance around the MLC via and the true location.

U.S. Pat. No. 3,905,818 Margrain discloses a method and an apparatus for printed circuit manufacture wherein an electrical circuit is traced on a metal layer or foil by one or several actinic light spots which are moved with respect to a photo-sensitive film with which the metal foil or layer is coated. An optical fiber strand is used which is moved relative to the photo-sensitive layer.

U.S. Pat. No. 3,651,567 Fenner et al discloses a method of making electronic components wherein an electrically conductive film is deposited on a substrate surface by a dry printing process which may comprise using a thin foil coated on one side with the material to form the electrically conductive film. The foil can be pressed against the substrate with a suitably shaped die causing the transfer of film-forming material from the foil to the substrate. The die is typically heated for the purposes of transfer.

U.S. Pat. No. 3,948,706 Schmeckenbecher discloses a method for forming metallized interconnection patterns on a ceramic green sheet with improved line definition and a process for metallizing via holes and recessed grooves in a ceramic green sheet, the major object of this patent being to avoid the use of a mask material and the attendant necessity for chemical etching. According to this patent, a sheet of a material such as a thermoplastic sheet is applied to a ceramic green sheet, openings are formed in the thermoplastic sheet in a desired pattern, a conductive metal paste is applied to the thermoplastic sheet to fill the openings and thereby form a metallized composite structure, the metallized composite structure is laminated to at least one other similar composite structure and the resulting laminated structure is fired to volatilize the thermoplastic sheet and sinter the ceramic green sheet.

U.S. Pat. No. 3,990,142 Weglin discloses a method of making a circuit board where a sheet of conductive foil is stamped by a die of a predetermined pattern against a dielectric substrate to shear out a foil section which is then pressed against the substrate while applying heat through the die to bond the sections using a thermal curing adhesive to the substrate. The dies must exhibit a rather specific structure.

U.S. Pat. No. 4,237,606 Niwa et al discloses a method for manufacturing a multi-layer ceramic board where a conductor land is formed and baked on a first substrate. A second substrate on which a wiring pattern is formed is then electrically connected to the first substrate via the land. Any errors due to shrinkage at the time of sintering are compensated for by the conductor land.

SUMMARY OF THE INVENTION

The present invention overcomes the problem of green (unfired) ceramic substrates shrinking nonuniformly during sintering which can lead to filled vias within the substrate being out of alignment with a top layer of metallurgy which is deposited after sintering.

This misalignment is prevented per the present invention by embossing a pattern of grooves in the top of the substrate prior to sintering, the pattern of grooves corresponding to the desired metallurgy pattern. Upon firing, the pattern of embossed grooves shrinks in the same non-uniform way as the remainder of the substrate and thus remains aligned with the vias.

Accordingly, the major object of the invention is to prevent misalignment between filled vias in a ceramic substrate with subsequently applied metallurgy.

Another object of the present invention is to provide a conductive pattern of a highly conductive material, such as copper, which cannot be co-fired with the ceramic substrate because it has a melting point below the sintering temperature of the ceramic substrate.

Yet a further object of the present invention is to provide a conductive pattern of high resolution, with line widths down to 15 μm, which represents a substantial improvement over line widths obtained by a typical silk screening process.

BRIEF DESCRIPTION OF THE DRAWINGS

FIGS. 1A to 1E illustrate one embodiment of the process of the present invention with side schematic views wherein:

In FIG. 1A the top of a typical stack of ceramic green sheets 10 containing the desired internal metallurgy 11 has just been embossed with die 12 to form recesses 13 in the upper ceramic green sheet 10A.

FIG. 1B shows only ceramic sheet 14 (which corresponds to ceramic green sheet 10(A) after sintering) and one via 11 after sintering having glaze 15 applied thereto.

FIG. 1C shows the ceramic sheet 14 after black wax 16 has been applied and wiped from all areas except recesses 13, with photomask 17 being shown, the same being generated from a photograph taken of the black wax 16 in the recesses 13.

FIG. 1D shows ceramic sheet 14 after the black wax 16 has been removed from the recesses 13 and a blanket metallization layer 18 has been deposited upon the ceramic sheet 14.

FIG. 1E shows ceramic sheet 14 after a conventional photo-etch has been conducted to leave conductive pattern 19 in the recesses 13.

In FIG. 2 ceramic sheet 14 is shown with via 11, the same having been coated with glaze 15; embossed recesses 13 have just been filed with copper paste 20 which is shown being removed from the recesses 13 by squeegee 21 and rubber sheet 22 which is biased against the surface of the ceramic sheet 14 by roller 23 and biasing means 24.

DESCRIPTION OF PREFERRED EMBODIMENTS

Figure 1A:
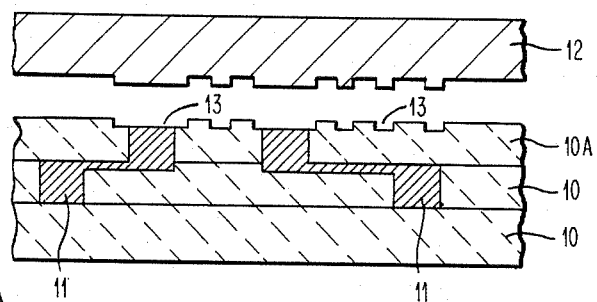
Figure 1B:
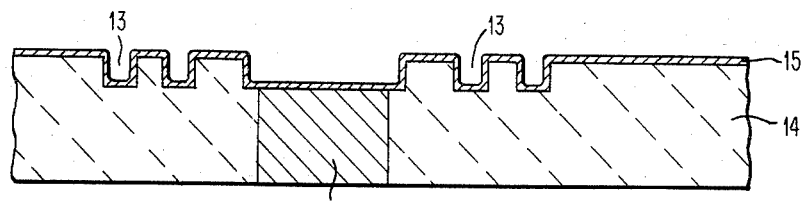
Figure 1C:
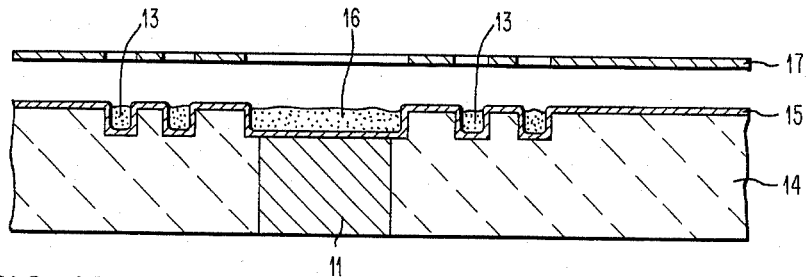
Figure 1D:
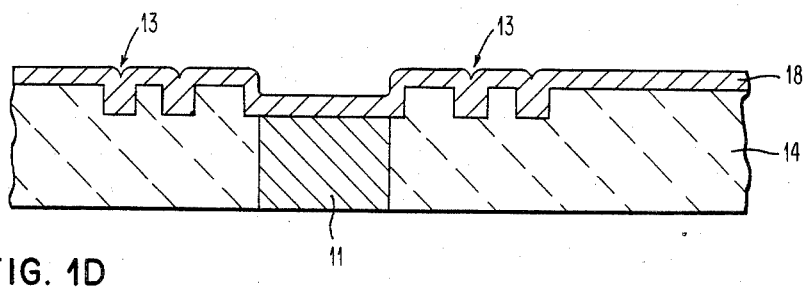
Figure 1E:
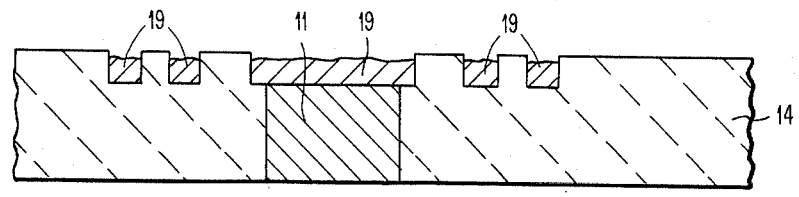
Figure 2:
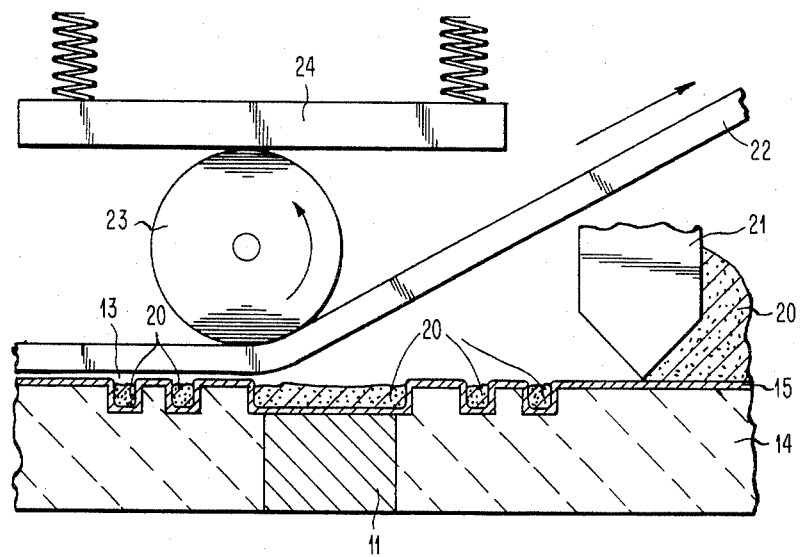
FIG. 2 illustrates the second embodiment of the present invention. As explained in the specification, the precursor to the device shown in FIG. 2 is identical to that described with reference to FIG. 1B and the final product will be identical to that shown in FIG. 1E.

The major process steps per the present invention include the following:

Firstly, embossing a pattern of grooves in the top surface of a green ceramic substrate.

Secondly, sintering the green ceramic substrate. Typically a plurality of green ceramic substrates are sintered at this stage to form a MLC.

Thirdly, depositing a conductive material in at least a portion of the embossed pattern of grooves.

In one preferred embodiment the conductive material is deposited in at least a portion of the embossed pattern of grooves by glazing the substrate with a polymeric material, applying a colored material such as a colored dye onto the substrate so that it fills the grooves, a photograph is taken of the substrate and used per se as a mask or a mask generated therefrom in a conventional manner and the mask, which includes any distortions in the pattern of grooves, is then used to photo-lithographically generate the desired metallurgy pattern in a conventional manner.

In a second preferred embodiment of the present invention the substrate is glazed with a polymeric material and a metal paste is applied onto the substrate so that it fills the desired pattern of grooves. The metal paste is then sintered to form the desired metallurgy pattern.

Having thus described broader preferred embodiments of the present invention, the following more detailed description is offered.

Useful Ceramics

The ceramics selected for use in the present invention are not unduly limited, and can be freely selected from ceramic materials as have been used in the prior art to form green unfired ceramic substrates. As will be appreciated by one skilled in the art, of course, if the green ceramic substrate is not subject to shrinkage problems, the present invention will be of minimal value, however; green ceramic substrates essentially all illustrate the characteristic of nonuniform shrinkage during sintering.

The main characteristic which useful ceramics illustrate per the present invention is that particles thereof can be sintered in green sheet form to a dense body.

After sintering, the ceramic substrate should be hermetic, i.e., not permeable to fluid which can corrode buried metallization patterns, e.g., molybdenum.

The thermal expansion coefficient of the ceramic substrate of the present invention is typically similar to that of silicon, i.e. on the order of $7.6 \times 10^{-6}/°C$.

The ceramic substrate of the present invention is typically extremely strong, i.e., it is shock and vibration resistant, and it has good thermal conductivity.

The electrical properties thereof are well suited for applications as contemplated in the present invention, e.g., the ceramic substrate can exhibit a dielectric constant of 10 or less and, for capacitor use can exhibit a high dielectric constant, e.g., 40 to 100. The ceramic substrate also typically exhibits a high breakdown voltage and low dielectric loss.

Useful ceramics include those as are conventional in the art, for example, alumina with silicate frit, beryliia (which has high thermal conductivity but poses a safety hazard), mullite, porcelains, glass-ceramics, glass and silica. Preferred ceramics include alumina with silicate frit (which serves as a binder) and glass-ceramics.

The size of the ceramic particles per the present invention is not overly important and is selected from those sizes as are conventionally used in the art. Typically, this is on the order of from about 2 $\mu$m to about 8 $\mu$m, and this size range can be adjusted by conventional procedures such as ball or vibro-milling, if desired or necessary, to reduce particle size.

The present invention finds particular application with high alumina content green ceramic substrates.

The Polymeric Binder

As is well known in the art, green ceramic substrates are formed of a particulate ceramic material in combination with a polymeric binder.

The polymeric binder used in the present invention can be freely selected from those polymeric binders used in the prior art.

The primary characteristics which the polymeric binder of the present invention exhibits is that it be thermoplastic, i.e., that it soften at elevated temperatures, that it be flexible (typically it contains a plasticizer), it be soluble in the volatile solvent(s) used to cast the same, and it can be sintered-off without any substantial amount of residue during the ceramic sintering cycle. Finally, the polymeric binder sould be permeable to gases to prevent bloating or delamination of a stack of ceramic green sheets during burning-off of the polymeric binder. All of these characteristics are well known in the art.

Preferred polymeric binders include those known in the art, e.g., acetals such as polyvinyl butyral, typically with dioctyl phthalate or dibutyle phthalate as a plasticizer, and generally with a conventional wetting agent and an organic solvent, polysaccharides such as guar gum, typically with glycerol as a plasticizer and water as a solvent, polyamides, polyvinyl alcohols, polyacetates, polyvinyl chloride, etc.

The currently preferred polymeric binder is polyvinyl butyral in combination with dioctyl phthalate and a conventional wetting agent.

The molecular weight of the polymeric binder is not important per the present invention and can be freely selected from molecular weights as are used in the prior art. As one skilled in the art will appreciate, it is only necessary that the polymeric binder permit easy formation of the slurry which is used to form the green ceramic substrate, provide sufficient strength so that the green sheet may be appropriately handled during processing, and be easily volatilized during sintering to permit clean removal thereof during formation of the fired ceramic substrate.

Optional Ingredients

In the formation of green ceramic sheets, the only essential ingredients are a particulate ceramic material and a polymeric binder illustrating the characteristics as above.

However, conventional additives as are well known in the art can be used, and generally will be used, in combination therewith, for example, high temperature frits such as calcium, magnesium and aluminum silicate, which lower the sintering temperature of the ceramic.

The proportion of such additives is not overly important, but typically will be on the order of about 2 to about 12 weight percent based on the weight of the ceramic.

Solvent

The slurry which is utilized to form the green ceramic sheet per the present invention is typically formed using a solvent. The solvent is selected from those as are conventionally used in the art.

As is well known in the art, the ceramic slurry used to form the green sheet may also contain a mixture of several organic solvents which have different boiling points in the range of about 60° C. to 160° C. Useful solvents typically include water, aliphatic alcohols, ketones and aromatic solvents. A currently preferred mixture is a mixture of ethanol, toluene and cyclohexanone.

Slurry Proportions

The slurry which is utilized to form the green ceramic sheet of the present invention contains proportions of the desired components as are conventional in the art.

While by no means limitative, typically this will be from about 55 to about 70 weight percent ceramic particles, from about 5 to about 8 weight percent polymeric binder, and from about 25 to about 40 weight percent solvent.

Slurry/Green Ceramic Sheet Formation

The slurry and the green ceramic sheet per the present invention are formed following conventional prior art procedures except, of course, for the embossing step of the present invention which is not disclosed in the prior art and is later discussed in more detail.

Reference should be made to the Kaiser et al article earlier incorporated by reference and to U.S. Pat. No. 4,237,606 Niwa et al earlier mentioned and also hereby incorporated by reference for disclosure regarding such.

Typically, however, the desired ceramic material(s) is/are weighed out in the proper proportion, particle size is adjusted if desired or necessary, the constituents of the organic binder such as the desired thermoplastic resin, a plasticizer and the solvent(s) are separately blended and then the ceramic phase and the organic phase are weighed out and blended in a ball mill, the resulting slurry (often called a slip) is cast into tape form by doctor blading onto a web of Mylar ®, the blade spreading the slurry into a uniform film. After the slurry is spread out on the Mylar ® web, it is typically allowed to remain until enough of the solvent has evaporated so that the slurry will not flow when moved. The thus partially dried slurry is allowed to completely dry ahd is then removed from the Mylar ® backing and is ready for use in subsequent operations.

Since typically the green ceramic sheet at this time is rather large in size, usually working blanks are cut from the green ceramic sheet and via holes are selectively punched in a standard grid pattern in the thus formed working blank.

At this stage, if desired, circuit metallization can be formed on the green sheet working blank by silk screening in a conventional manner using a conventional metal paste, e.g., of molybdenum or molybdenum and manganese metal powders in a conventional organic binder system.

Usually two silk screening operations are used. In a first step via holes are partially filled with the metal paste from the bottom using a generalized via fill pattern and in a second step the filling of the via holes from the top is completed and at the same time the circuit pattern is screened on the top of the working green sheet blank.

At this stage the embossing of the present invention and subsequent steps per the present invention will typically be conducted. These are later discussed in more detail.

After the procedure of the present invention is conducted, typically a stack of green ceramic blanks will be formed which will become the final module.

Generally, a set of working blanks is stacked over registration pins in the proper sequence, the stack is placed in a laminating press and moderate heat and pressure applied, e.g., typically from about 1500 to about 3000 psi and about 70° to about 90° C. for about 1 to about 15 minutes, whereupon the thermoplastic binder in the green sheet blank softens and the layers fuse together, deforming around the metallization pattern to completely enclose the lines. If desired, the embossing of the present invention can be performed simultaneously with this lammetation merely by replacing the top platen of the laminating press with the later described die. The conditions of embossing are, of course, the same as the laminating conditions in this instance.

Following the above procedure, the "green substrate" is fired, typically at about 1350° to about 1650° C. for about 16 to about 24 hours in an atmosphere such as wet hydrogen in a conventional manner.

The substrate is now ready for various post-sintering operations which are conventional in the art and which are disclosed in detail in the Kaiser et al article earlier incorporated by reference.

The Inventive Steps

The present invention typically finds application in a conventional prior art process as above described at the stage when the stack of green sheet blanks which will become the final substrate has been formed, i.e., working blanks have been cut from the cast green sheet, registration holes have been provided, via holes have been selectively punched, the desired metallurgy or circuit pattern on the green ceramic blanks have been formed (they have been personalized) and the via holes have been filled using the above described technique. We wish to emphasise that the above procedures are all conventional in the prior art; typically at this stage, the structure is a 50 mm×50 mm square 2 mm thick multilayer ceramic structure containing, for example, 10 layers, each layer on the order of 5.5 mils thick. Further details on the exact description of such a substrate are given in the Kaiser et al. article earlier incorporated by reference.

At this stage, a pattern of 15–75 μm wide grooves and pads of various sizes and shapes is embossed into the top layer of the stack of personalized ceramic green sheets.

The exact nature of the embossing is not overly important but typically the stack of ceramic green sheets is heated to a temperature at which the thermoplastic polymeric binder in the ceramic green sheets flows and can be shaped under pressure.

A die which carries a raised mirror image of the desired metallization pattern and which preferably is coated with a thin layer of a conventional release agent is pressed against the surface of the stack of ceramic green sheets. After removal of the die, the surface of the stack of ceramic green sheets carries the desired pattern as indentations or recesses, e.g., grooves or trenches are left in the surface where the metallization pattern (conductor lines) are to be formed.

The depth of the indentations is most preferably such that the narrowest grooves are at least as deep as they are wide, i.e., they have an aspect ratio of 1:1 or more.

Obviously, since the green ceramic blank stack at this stage has been formed, the grooves are formed only in the top green ceramic.

Embossing conditions are not overly important, but typically for polyvinyl butyral embossing will be at a temperature of about 75° to about 95° C. and typically at a pressure of from about 500 to 3000 p.s.i. As earlier indicated, embossing can be simultaneous with laminating. However, when subsequent thereto, the conditions may be a bit milder, as indicated, though this is not mandatory. Embossing is prior to firing, of course.

The best conditions for embossing depend upon the polymeric binder material in the ceramic green sheets. The viscosity of a thermoplastic material decreases with increasing temperature, and thus the temperature for embossing should be such that the viscosity is sufficiently low to permit the surface of the ceramic green sheet to be shaped or molded by the embossing die at moderate pressure. On the other hand, the temperature should not be so high that the stack of ceramic greet sheets cannot be handled without deformation, i.e., so that the stack of ceramic green sheets does not flow under its own weight. As will be apparent to one skilled in the art, thermal decomposition should not occur.

The best temperature/pressure range is obtained using a test die with a raised pattern thereon having a known height. Embossing is conducted at various temperatures and pressures and the depth of the embossed grooves is measured. For example, at a given temperature the embossing can be carried out at increasing pressures, the depth of the embossed grooves at low pressures typically being low and, with increasing pressure, the embossing will approach a depth close to the height of the raised pattern on the die.

The minimal pressure required to give the desired depth is considered to be, at present, the best pressure at the desired temperature.

The grooves correspond substantially to the final metallization pattern which is to be formed on the top green ceramic blank of the MLC structure. As will be appreciated by one skilled in the art, the metallization pattern can take any conventional form and will typically consist of narrow conductive metallization lines with a width of from about 15 μm to 50 μm and pads of various sizes and shapes which are used to make connections to other components of the system, for example, 125 μm diameter circular pads, which are typically used to make connections to intergrated circuit chips.

Following the above embossing step, the stack is then sintered at the heretofore given conditions to form a fired MLC substrate.

The fired MLC which still contains the embossed pattern is nextly coated with a glazing material.

The reason for coating with the glazing material is that the surface of a fired ceramic as is typically used to form an MLC substrate is relatively rough, and it is very difficult to remove materials from the areas between embossed recesses unless a glazing material is used. For example, typical ceramic materials as are used to form MLCs illustrate a surface roughness (center line average) on the order of about 0.2 μm to 0.5 μm, as measured with a "Tallysurf" tracer (Tayler-Hobson Co.).

The glazing material initially is a liquid which is applied on the ceramic surface. It fills recesses, gaps between particles, etc., by capillary action and it coats the ceramic surface. It then solidifies, e.g., by evaporation of a solvent, providing a relatively smooth solid surface. The glaze does not interact with the solvent in the vehicle of the metallization paste which is used to fill the embossed patterns. This lack of interaction and the relative smoothness of the glaze surface permits removal of the metallization paste from the areas between embossed recesses merely by wiping.

Preferably, the glazing material can be completely removed after the metallization paste has been wiped into the recess. For example, if the metallization paste is sintered in water vapor and hydrogen at about 900° C., the glaze volatilizes together with the organic materials in the metallization paste vehicle.

The glazing materials are organic materials which are soluble in volatile solvents and which, after evaporation of the solvent or solvents, do not interact with the solvents in the metallization paste vehicle or with the coloring material used to fill the recesses.

The nature of the solvent is not overly important so long as it yields a solution of the glazing material of a suitable viscosity for the application techniques above discussed.

For example, classes of useful solvents include aqueous solutions, aliphatic alcohols aromatic solvents, chlorinated hydrocarbons, etc.

Especially preferred solvents include, for example, water for water-soluble resins and aliphatic alcohols for alcohol-soluble resins, e.g., a solution of polyvinyl alcohol and water or a solution of polyamide in methyl alcohol offers excellent results.

Specific glazing materials include polyvinyl alcohol with water as a solvent; the same can be used with any metallization paste vehicle or wax which does not contain water.

Another specific glazing material is a polyamide in methanol which can be used with any metallization paste or wax which does not contain a similar alcohol, e.g., methanol, ethanol, propanol, butanol, benzyl alcohol, furfuryl alcohol or m-cresol.

The exact molecular weight of the glazing material selected is not overly important, and generally is set so as to provide a viscous solution of the glazing material which can be applied to the sintered, embossed ceramic by conventional methods such as dip coating, spraying, brushing or, alternatively, if the glazing material is thermoplastic, by applying the same as a powder and fusing the same, etc.

Typically, the glazing material is applied by dipping or spraying a solution of the glazing material onto the surface of the MLC.

For example, in dip coating the surface to be coated is mounted vertically and dipped into the solution, withdrawn at a constant rate and placed in a horizontal position and permitted to dry.

As will be apparent to one skilled in the art, the thickness of the glazing layer after drying depends upon the viscosity of the solution and the withdrawal rate, e.g., the slower the withdrawal rate the smaller the amount of glazing material on the surface, with a contrary effect at faster withdrawal rates. A relatively slow withdrawal rate of 1 inch/minute typically provides good results but this can be freely varied by one skilled in the art.

The desired average thickness of the glazing material on the ceramic surface after drying should be such that the metallization paste can be wiped off completely from the areas between recesses.

The concentration of the glazing material (organic polymer) in the solvent is not overly important and is generally set upon a consideration of the viscosity of the solution. Typically, for dip coating on the order of about 100 cps to about 2,000 cps provides easy application and easy drying.

Following application of the glazing material, the solvent is removed therefrom by drying, usually at a temperature on the order of about 18° C. to 60° C., though this is not limitative.

It is important that the glazing material form a smooth layer on the top of the MLC hut that it not completely fill the recesses. For recesses having a depth of about 10 μm to 50 μm as are often used in the present invention, it is most preferred that the glazing material not fill more than about 30% of the total depth of the embossed recesses, most preferably no more than about 15% of the depth of the recesses However, the glazing material should be applied to a sufficient thickness to permit the metallization paste to be wiped completely from the surface between the recesses, i.e., to reduce surface roughness.

The glazing material should not be soluble in the coloring material later to be applied or the vehicle of the metallization paste later to be described.

It is most preferred that the glazing material be one which can be removed after any one of the two procedures described below.

After drying of the glazing material, two embodiments are presented in the present invention.

In a first embodiment, after application of the glazing material and drying, a metallization paste is applied in the recesses so as to deposit paste in the recesses. Since the metallization pattern is desired only in the recesses, surplus paste, if any, is removed from the areas between the recesses in any conventional manner, e.g., by wiping.

The MLC is then fired to burn off the glazing material and the vehicle in the metallization paste and to sinter the metal particles in the metallization paste into a well adhering metallization (conductor) pattern.

The metallization paste used may be freely selected from those conventionally used in the art so long as the vehicle can be burned off at the sintering conditions and the metal particles therein will be small enough to fit into the recesses and will sinter into a well adhering metallization pattern at the sintering conditions.

Since firing of metallization pastes is well known in the prior art, it will be appreciated by one skilled in the art that the conditions can be freely selected from those used in the prior art. Typically firing is at about 800° C. to about 950° C. for about 10 to about 60 minutes in an inert or reducing atmosphere at atmospheric pressure.

However, an atmosphere of water vapor with a small amount of hydrogen is preferred. This atmosphere at 900° C. completely volatilizes the organic glazing material. The small amount of hydrogen keeps certain metals, for example, copper, from being oxidized. If a copper paste is fired in a nitrogen or dry hydrogen atmosphere, charred carbon residues are left from the glazing material. These residues can be removed by plasma ashing, if desired.

Typical metal pastes include copper or gold metallization pastes, or alloy pastes, such as a silver-palladium paste, etc.

The second embodiment of the present invention is identical to the first embodiment up to and including the step of applying and drying the glazing material.

At this stage of the process, however, a coloring material is applied into the grooves over the glazing material. The exact amount of the coloring material is not important in any fashion so long as it has a color sufficiently different from the top layer of the MLC at this stage so that a photograph thereof can be taken to permit a mask generation step.

Essentially any colored soft material can be used which can be smeared or wiped into the recesses and which can be removed, for example, by solvents, by burning-off or by "lift-off" of the glazing material.

Typical examples of useful coloring materials include black or colored waxes, for example, conventional shoe polish wax, wax from a crayon, from a china marker, a wax paste containing pigment particles such as PR201-R Wornow stop-off resist available from the Dexter Corp., Olean, N.Y., a molybdenum paste, for example molybdenum particles in a screen printing vehicle, a paste or wax containing a fluorescent material which can be viewed and photographed in ultra-violet light, etc.

Currently preferred coloring materials include black waxes, for example, even a material such as commercially available Kiwi shoe polish can be used.

As will be apparent to one skilled in the art, the coloring material should only be present in the recesses since if it is present elsewhere, the photograph which is taken for mask generation will not provide the desired results. Accordingly, if coloring material is present outside the recesses, it should be removed by a conventional technique such as, e.g., wiping.

Following the above procedure, a photograph is taken of the top of the MLC. Typically, a lens is used which forms a image of the same size on a photographic film, i.e., of 1× magnification, with correction for lens inversion.

In order to avoid the effects of random movement during exposure, lamps which flash for a very short time at high intensity are preferred.

The coloring material, for example, if it is a black wax such as Kiwi shoe polish, is then removed by any conventional procedure, e.g., dissolving in an organic solvent such as xylene, though other procedures such as volatilizing by heating or removal by chemical action can be used. Thus, if black wax is in the recesses on top of a polyvinyl alcohol glaze layer, a soak in hot water is sufficient to remove polyvinyl alcohol and also to "lift-off" the black wax.

The photograph which has been generated from the coloring material pattern on the top of the MLC can then be utilized directly as a photomask or it can be used to make a photomask by conventional techniques which will correlate exactly with the coloring material.

A layer or layers of metal, e.g., 400 Å Cr and 4,000 Å Cu are then typically evaporated on the surface of the MLC substrate. The desired pattern is photoetched into the metal by conventional techniques, for example, a photoresist layer is deposited, exposed to actinic light through a photomask and developed. The metal layer, where it is exposed, is chemically etched in a conventional fashion, leaving the desired conductive metallization pattern in the recesses.

Following the above, the MLC is now ready for various conventional operations, for example, integrated circuit chips, wires for engineering changes and/or other electronic components such as capacitors can be connected to the circular pads earlier mentioned. If desired, the substrate may be encapsulated in a protective plastic or a hermetic cap with heat sinks, etc., may be attached.

Having thus generally described the invention, the following working examples are given to illustrate currently preferred best modes of practicing the invention.

EXAMPLE 1

In this example, the final MLC comprised 10 layers, each layer being 140 $\mu$m thick and having the following dimensions: 50 mm $\times$ 50 mm. The ceramic material used was conventional and comprised 92 wt. % $Al_2O_3$ and 8 wt. % silicate frit (Ca, Mg, Al silicates). The average particle size thereof was 4 $\mu$m.

The binder selected was conventional and comprised a mixture of polyvinyl butyral (Butvar ® from Monsanto), dioctyl phthalate as a plasticizer and Tergitol ® as a wetting agent.

The solvents selected were conventional and comprised a mixture of cyclohexanone, ethanol and toluene.

The ceramic frit, binder and solvent were then ball milled in a conventional fashion.

A green sheet having a thickness of 200 $\mu$m was produced from the slurry obtained using a conventional doctor blading method.

The green sheet was then dried in air for 12 hours, whereafter the same was cut into working blank having the following dimensions: 185 $\times$ 185 mm and registration holes were punched therein in a conventional manner.

Thereafter, via holes having a diameter of 125 $\mu$m were selectively punched on a standard grid pattern in each working blank.

Following the above procedure, the via holes were filled from the bottom and then the top in a conventional manner using a metallization paste, which contained 80 wt. % molybdenum particles, balance organic vehicle.

Thereafter, a wiring pattern was formed by printing a similar metallization paste on each working blank, except for the blank which is to be the top blank of the MLC, in a conventional manner, forming the desired metallization pattern on the working blanks such as redistribution layers, ground planes, etc. For an example of a typical intermediate product at this stage, see Microelectronic Packaging, Scientific American, July, 1983, for example, at page 87.

Following the above procedure, a pattern of 25-75 $\mu$m wide grooves, and pads such as circular pads 125 $\mu$m in diameter, and pads of irregular shape, was embossed to a depth of about 16 $\mu$m into the top of the stack of 10 ceramic green sheets by the following procedure.

The upper and lower platens of a hydraulic press were heated by resistance heating to 75° C. The stack of ceramic green sheets was placed on the lower platen. A molybdenum die which carried the desired pattern as photoetched features, raised 16 $\mu$m above the surface of the die, was coated by spraying with a thin coat of a conventional release agent (Mold Release for Acetals, Price Driscoll Corp., Faringdale, N.Y.) and was placed with the pattern down on top of the stack of ceramic green sheets in a position defined by location holes both in the stack of ceramic green sheets and in the die.

The lower platen of the press was pushed upward against the upper platen, thereby pressing the die against the ceramic green sheets and was kept at a pressure of 1,000 psi for 1 minute. The platens were then separated and the die was removed from the stack of ceramic green sheets.

The green ceramic working blank stack was then sintered at 1,560° C. for 16 hours in a water vapor and hydrogen atmosphere.

After firing, the pattern of grooves (each groove) was about 20 $\mu$m wide and each groove was typically 12-16 $\mu$m deep, measured on a light sectioning microscope.

The fired MLC substrate was then dipped into a 7.5 weight percent solution of a high molecular weight, cold water soluble polyvinyl alcohol having a degree of hydrolysis of 87.2-89.2% and a viscosity of 348 centipoise as determined with a Haake Rotovisco RV3 Viscometer.

The MLC substrate with the surface in a vertical position was withdrawn from the polyvinyl alcohol solution at a constant rate of 2.5 cm/min. then placed in a horizontal postion with the embossed surface up, and was allowed to dry in air for about 1-2 hours.

Following the above drying, a copper metallization paste of a viscosity of 264 Pascal-seconds as determined with a Ferranti cone and plate type viscometer at a shear rate of 40 sec$^{-1}$ at room temperature was doctor bladed into the recesses so as to fill the same and cover the glazing material. Surplus metallization paste was removed from the areas between the recesses by a wiping technique as described in IBM Technical Disclosure Bulletin, Vol. 16, No. 11, April 1974, p. 3580, incorporated by reference.

The MLC intermediate at this stage was then heated in an atmosphere of water vapor and a small amount of hydrogen at 900° C. The water vapor at this temperature oxidized the organic materials (polyvinyl alcohol and the paste vehicle) into volatile compounds, such as carbon dioxide. The hydrogen kept the copper from forming excessive amounts of copper oxides. The copper particles were sintered into a well adhering metallization layer.

Integrated circuit chips were then joined to the copper pads in a conventional manner, the substrate was inclosed in a hermatically sealed cap, input/output pins were attached to the bottom side and conventional steps taken to form a complete multilayer ceramic module.

EXAMPLE 2

The procedures of Example 1 up to and including the glazing step were followed.

Following glazing, a black wax, specifically Kiwi shoe polish, was wiped into the grooves to a thickness of about 10 μm. Any of the black wax outside the grooves was removed by wiping with a soft absorbent cloth.

A photograph was then taken of the top of the MLC intermediate at this stage using a 20 mm diameter f8 1× lens from Nikon (APO NIKON). The substrate was lit using 4 circularly disposed 2000 standard flash lamps from Novation Dallas Inc. Each lamp was powered by a model 1081 power supply from Novation Dallas Inc. To avoid the effects of random movement, flashes powered by 800 watts for each lamp were used with an exposure time of 1/1000 sec.

The black wax was then removed by dissolving the same in xylene whereafter the polyvinyl alcohol glaze was removed by dissolving in water.

The resulting photograph was used to form a photomask in a conventional manner. If desired, however, the procedure of copending U.S. application Ser. No. 415,051 filed Sept. 7, 1982 by Amendola et al may also be used.

A layer of the desired metallurgy was formed using a conventional metal evaporation technique and, after a conventional photoetching using a negative photo resist in a manner well known to the art, the desired metallization pattern was formed in the recess. Subsequent processing was as per Example 1.

While there have been described what are at present considered to be the preferred embodiments of this invention, it will be obvious to those skilled in the art that various changes and modifications can be made therein without departing from the invention, and it is, therefore, intended to cover all such changes and modifications as fall within the true spirit and scope of the invention.

We claim:

1. A process for forming a pattern of conductive lines on the top of a multi-layer ceramic substrate comprising the steps of:
    providing a green ceramic substrate;
    embossing a pattern of grooves in the top surface of the green ceramic substrate;
    sintering the green ceramic substrate to thereby form a multi-layer ceramic substrate;
    depositing a conductive material in at least a portion of said embossed pattern of grooves, wherein said depositing comprises the steps of:
        glazing the top of said multi-layer ceramic substrate with a glazing material;
        wiping a colored substance in at least a portion of said embossed pattern of grooves;
        taking a photograph of the top of said multi-layer ceramic substrate;
        generating a mask from said photograph; and
        photolithographically depositing a conductive material on the top of said multi-layer ceramic substrate in accordance with the pattern of said mask and in said pattern of grooves using a photoresist formed by developing a deposited photoresist forming layer exposed through the mask, wherein subsequent to taking the photograph but prior to photolithographically depositing the conductive material the colored substance is removed form the embossed pattern of grooves.

2. The process of claim 1 wherein the conductive material is copper which has a melting point lower than the sintering temperature of the ceramic substrate.

3. The process of claim 1 wherein said pattern of grooves has a line width down to 15 μm.

4. The process of claim 1 wherein glazing is with a synthetic resinous material.

5. The process of claim 1 wherein the ceramic substrate has a surface roughness of from about 0.2 μm to 0.5 μm.

6. The process of claim 1 wherein the glazing material is initially liquid.

7. The process of claim 1 wherein the glazing material is completely removed after the conductive material is deposited.

8. The process of claim 1 wherein the glazing material does not fill more than about 30% of the total depth of the embossed pattern of grooves.

9. The process of claim 1 wherein the glazing material does not fill more than about 15% of the total depth of the embossed pattern of grooves.

10. The process of claim 1 wherein the photolithographically depositing comprises evaporating a layer of metal onto the substrate, depositing the photoresist forming layer on the metal layer to form the photoresist, exposing the photoresist through the mask, developing the photoresist in accordance with the pattern of said mask and in accordance with said pattern of grooves, whereafter the metal layer is etched through the photoresist.

11. The process of claim 1 where said grooves have an aspect ratio of at least 1:1.

* * * * *